(12) United States Patent
Chen et al.

(10) Patent No.: US 9,275,752 B2
(45) Date of Patent: Mar. 1, 2016

(54) READ-ONLY MEMORY

(71) Applicant: Taiwan Semiconductor Manufacturing Company Limited, Hsin-Chu (TW)

(72) Inventors: Kuang Ting Chen, Taipei (TW); Ching-Wei Wu, Caotun Town (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 7 days.

(21) Appl. No.: 14/259,426

(22) Filed: Apr. 23, 2014

(65) Prior Publication Data
US 2015/0310924 A1    Oct. 29, 2015

(51) Int. Cl.
| | |
|---|---|
| G11C 17/00 | (2006.01) |
| G11C 17/16 | (2006.01) |
| G11C 17/18 | (2006.01) |
| G11C 5/06 | (2006.01) |
| G11C 17/12 | (2006.01) |
| G11C 11/56 | (2006.01) |

(52) U.S. Cl.
CPC *G11C 17/16* (2013.01); *G11C 5/06* (2013.01); *G11C 17/12* (2013.01); *G11C 17/126* (2013.01); *G11C 17/18* (2013.01); *G11C 11/5678* (2013.01)

(58) Field of Classification Search
CPC ........ G11C 17/16; G11C 17/12; G11C 17/18; G11C 11/5678
USPC ............. 365/96, 104, 185.18, 185.23, 185.26
See application file for complete search history.

(56) References Cited

U.S. PATENT DOCUMENTS

| | | | |
|---|---|---|---|
| 6,212,102 B1 * | 4/2001 | Georgakos et al. ...... | 365/185.18 |
| 6,307,781 B1 * | 10/2001 | Shum ....................... | 365/185.17 |
| 7,215,563 B2 * | 5/2007 | Brandon et al. ................ | 365/94 |
| 7,471,570 B2 * | 12/2008 | Morton et al. ........... | 365/185.28 |
| 8,072,811 B2 * | 12/2011 | Lee et al. ................. | 365/185.17 |
| 8,120,966 B2 * | 2/2012 | Lee .......................... | 365/185.22 |

* cited by examiner

*Primary Examiner* — Pho M Luu
(74) *Attorney, Agent, or Firm* — Cooper Legal Group, LLC

(57) ABSTRACT

A configuration for a bit-1 read-only memory (ROM) cell is provided. The bit-1 ROM cell comprises a first circuit connected to a second circuit. The first circuit comprises a first transistor and the second circuit comprises a second transistor. The second circuit is configured to receive a YMUX signal. The second circuit is connected to a word-line bar. The second circuit is configured to maintain a disconnection or connection between the first transistor and the word-line bar based upon the YMUX signal. The first circuit is located on a different physical layer than the second circuit.

20 Claims, 6 Drawing Sheets

READ-ONLY MEMORY

BACKGROUND

Read-only memory (ROM) is a type of memory that persistently stores content or data. Typically, a ROM device comprises a memory arrangement having a plurality of bit-1 ROM cells and bit-0 ROM cells, where a bit-1 ROM cell is configured as storing a bit of data equal to 1 and a bit-0 ROM cell is configured as storing a bit of data equal to 0. To read a memory cell within a memory arrangement of a ROM device, a voltage is applied to the memory cell. If the memory cell is a bit-1 ROM cell, the memory cell produces a first response. If the memory cell is a bit-0 ROM cell, the memory cell produces a second response different than the first response. Thus, depending upon the response of the memory cell to the applied voltage, the memory cell is determined to be a bit-1 ROM cell or a bit-0 ROM cell, and thus as storing a 0 or a 1.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
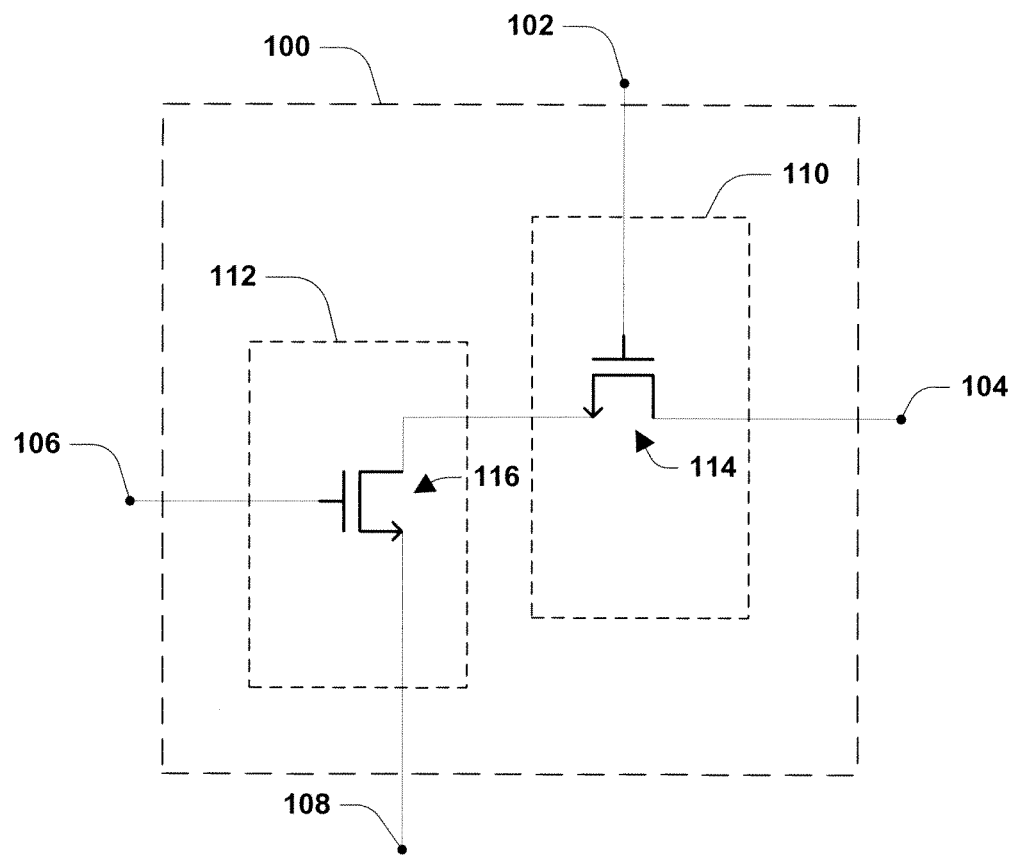
FIG. 1 is an illustration of a bit-1 read-only memory (ROM) cell, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a bit-1 read-only memory (ROM) cell is provided. In some embodiments, the bit-1 ROM cell is comprised within a memory arrangement that is comprised within a ROM device. In some embodiments, the memory arrangement comprises a plurality of bit-1 ROM cells and a plurality of bit-0 ROM cells. In some embodiments, the bit-1 ROM cell is configured to store a bit of data equal to 1. In some embodiments, a bit-0 ROM cell is configured to store a bit of data equal to 0. In some embodiments, the bit-1 ROM cell has a different circuit configuration than the bit-0 ROM cell.

A bit-1 ROM cell 100 according to some embodiments is illustrated in FIG. 1. In some embodiments, the bit-1 ROM cell 100 comprises a first circuit and a second circuit. In some embodiments, the first circuit is a bit-1 ROM circuit 110. In some embodiments, the second circuit is a source control circuit 112. In some embodiments, the bit-1 ROM circuit 110 comprises a first transistor 114. In some embodiments, the first transistor 114 comprises an NMOS transistor. In some embodiments, the source control circuit 112 comprises a second transistor 116. In some embodiments, the second transistor 116 comprises an NMOS transistor.

In some embodiments, a drain of the first transistor 114 is connected to a bit-line 104 of a ROM device within which the bit-1 ROM cell 100 is comprised. In some embodiments, a gate of the first transistor 114 is connected to a word-line 102 of the ROM device. In some embodiments, a source of the first transistor 114 is connected to a drain of the second transistor 116. In some embodiments, a gate of the second transistor 116 is connected to a first node 106 of the ROM device. In some embodiments, a YMUX signal exists at the first node 106. In some embodiments, the first node 106 corresponds to a YMUX connection. In some embodiments, a source of the second transistor 116 is connected to a word-line-bar 108 of the ROM device.

Figure 2:
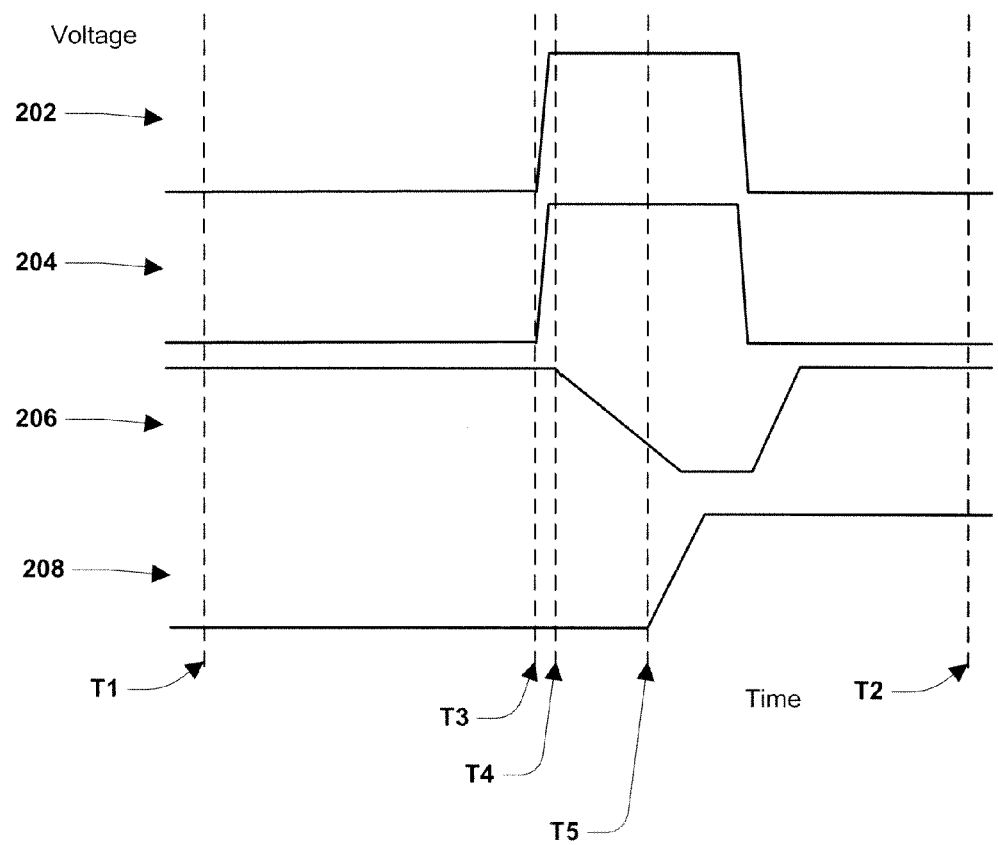
FIG. 2 is an illustration of waveforms associated with reading a bit-1 ROM cell, according to some embodiments.

FIG. 2 illustrates waveforms of various signals associated with an embodiment of the bit-1 ROM cell 100. In some embodiments, a waveform 202 illustrates values of a voltage of the YMUX signal at the first node 106 from a first point in time T1 to a second point in time T2. In some embodiments, a waveform 204 illustrates values of a voltage at the word-line 102 from the first point in time T1 to the second point in time T2. In some embodiments, a waveform 206 illustrates values of a voltage at the bit-line 104 from the first point in time T1 to the second point in time T2. In some embodiments, a waveform 208 illustrates values of a voltage at an output port of the ROM device that is operably coupled with the bit-1 ROM cell 100, from the first point in time T1 to the second point in time T2. In some embodiments, the first point in time T1 occurs before a read operation of the bit-1 ROM cell 100. In some embodiments, the second point in time T2 occurs after the read operation of the bit-1 ROM cell 100. In some embodiments, during the read operation of the bit-1 ROM cell 100, the voltage at the output port becomes a voltage within a voltage range that represents a bit of data equal to 1, due to the configuration of the bit-1 ROM cell 100.

In some embodiments, the waveform 202 illustrates that, at the first point in time T1, the voltage of the YMUX signal is within a low voltage state voltage range. In some embodiments, the low voltage state voltage range comprises voltages between about 0 V to about 2 V. In some embodiments, the waveform 204 illustrates that, at the first point in time T1, the voltage at the word-line 102 is within the low voltage state voltage range. In some embodiments, the waveform 206 illustrates that, at the first point in time T1, the voltage at the bit-line 104 is within a high voltage state voltage range. In some embodiments, the high voltage state voltage range comprises voltages between about 3 V to about 5 V. In some embodiments, the waveform 208 illustrates that, at the first point in time T1, the voltage at the output port is within the low voltage state voltage range.

In some embodiments, the waveform 202 illustrates that, at a third point in time T3, the voltage of the YMUX signal begins to change from a voltage within the low voltage state voltage range to a voltage within the high voltage state voltage range. In some embodiments, the waveform 204 illustrates that, at the third point in time T3, the voltage at the word-line 102 begins to change from a voltage within the low voltage state voltage range to a voltage within the high voltage state voltage range.

In some embodiments, the waveform 202 illustrates that, at a fourth point in time T4, the voltage of the YMUX signal is within the high voltage state voltage range. In some embodiments, when the voltage of the YMUX signal is within the high voltage state voltage range, the second transistor 116 is activated, which causes a connection between the source of the first transistor 114 and the source of the second transistor 116. In some embodiments, the waveform 204 illustrates that, at the fourth point in time T4, the voltage at the word-line 102 is within the high voltage state voltage range. In some embodiments, when the voltage at the word-line 102 is within the high voltage state voltage range, the first transistor 114 is activated, which causes a connection between the drain of the first transistor 114 and the source of the first transistor 114. In some embodiments, at the fourth point in time T4, the bit-line 104 is connected to the word-line bar 108 due to the first transistor 114 being activated and the second transistor 116 being activated. In some embodiments, at the fourth point in time T4, a voltage at the word-line bar 108 is within the low voltage state voltage range. In some embodiments, at the fourth point in time T4, the voltage at the word-line bar 108 is substantially equal to 0 V. In some embodiments, at the fourth point in time T4, the voltage at the bit-line 104 begins to change to a voltage within the low voltage state voltage range.

In some embodiments, at a fifth point in time T5, the voltage at the bit-line 104 is within the low voltage state voltage range, and the voltage at the output port begins to change to a voltage within the high voltage state voltage range. In some embodiments, the voltage within the high voltage state voltage range represents a bit of data equal to 1.

In some embodiments, a word-line is connected to a plurality of bit-1 ROM cells. In some embodiments, the plurality of bit-1 ROM cells does not comprise a source control circuit. In some embodiments, the plurality of bit-1 ROM cells comprises a plurality of bit-1 ROM circuits. In some embodiments, the plurality of bit-1 ROM circuits comprises a plurality of transistors. In some embodiments, a bit-1 ROM circuit within the plurality of bit-1 ROM circuits comprises one transistor within the plurality of transistors. In some embodiments, a drain of a transistor within the plurality of transistors is connected to a bit-line. In some embodiments, the plurality of transistors is connected to a plurality of bit-lines. In some embodiments, a gate of a transistor within the plurality of transistors is connected to the word-line. In some embodiments, a source of a transistor within the plurality of transistors is connected to a first voltage source, instead of being connected to a source control circuit, as illustrated in FIG. 1. In some embodiments, the first voltage source is ground. In some embodiments, at a point in time, a read operation is performed on a first bit-1 ROM cell within the plurality of bit-1 ROM cells. In some embodiments, the first bit-1 ROM cell is the only bit-1 ROM cell within the plurality of bit-1 ROM cells that undergoes a read operation at the point in time. In some embodiments, at the point in time, the voltage at the word-line changes to a voltage within a high voltage state voltage range that causes the plurality of transistors to become activated. In some embodiments, the plurality of bit-lines couples with the first voltage source. In some embodiments, activation of the plurality of transistors increases energy consumption of the ROM device. In some embodiments, it is desirable to limit energy consumption of the ROM device. Therefore, in some embodiments, it may be desirable to maintain a disconnection between the first voltage source and a bit-line connected to a ROM cell that is not undergoing a read operation, as is implemented in the embodiment illustrated in FIG. 1.

Figure 3:
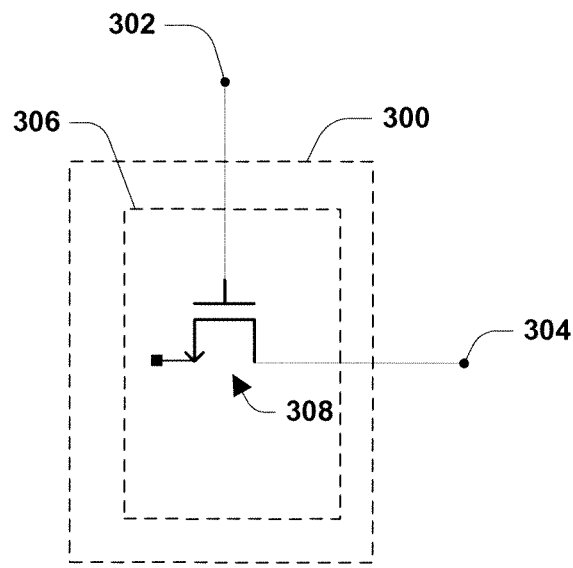
FIG. 3 is an illustration of a bit-0 ROM cell, according to some embodiments.

A bit-0 ROM cell 300 according to some embodiments is illustrated in FIG. 3. In some embodiments, the bit-0 ROM cell 300 comprises a third circuit. In some embodiments, the third circuit is a bit-0 ROM circuit 306. In some embodiments, the bit-0 ROM circuit 306 comprises a third transistor 308. In some embodiments, the third transistor 308 comprises an NMOS transistor.

In some embodiments, a drain of the third transistor 308 is connected to a bit-line 304 of the ROM device within which the bit-0 ROM cell 100 is comprised. In some embodiments, a gate of the third transistor 308 is connected to a word-line 302 of the ROM device. In some embodiments, a source of the third transistor 308 is not connected to a conductive node of the ROM device.

Figure 4:
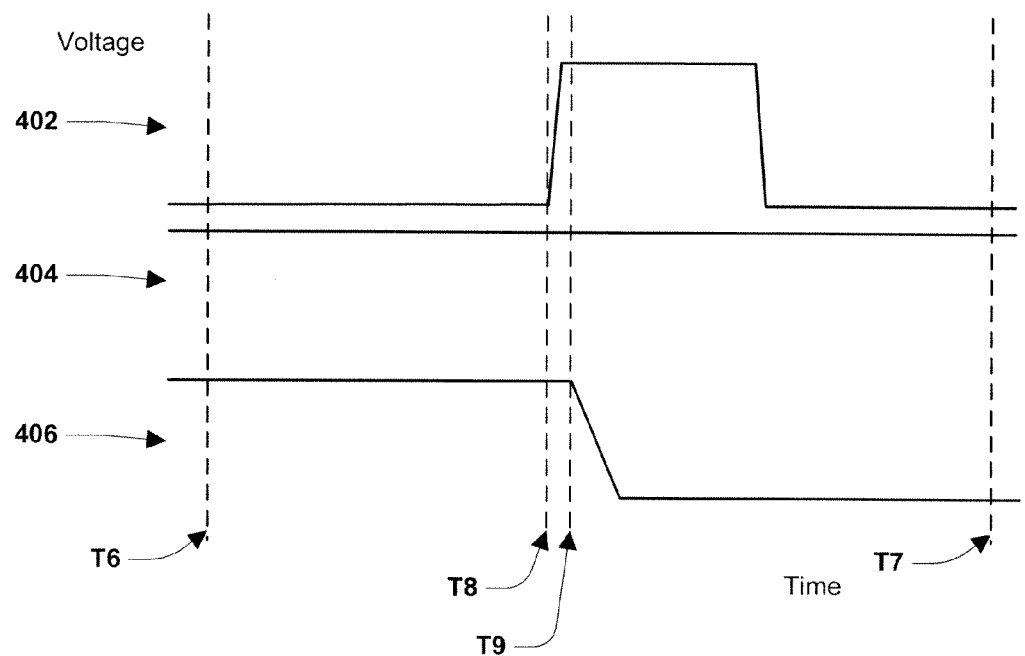
FIG. 4 is an illustration of waveforms associated with reading a bit-0 ROM cell, according to some embodiments.

FIG. 4 illustrates waveforms of various signals associated with an embodiment of the bit-0 ROM cell 300. In some embodiments, a waveform 402 illustrates values of a voltage at the word-line 302 from a sixth point in time T6 to a seventh point in time T7. In some embodiments, a waveform 404 illustrates values of a voltage at the bit-line 304 from the first sixth point in time T6 to the seventh point in time T7. In some embodiments, a waveform 406 illustrates values of a voltage at an output port of the ROM device that is operably coupled with the bit-0 ROM cell 300, from the sixth point in time T6 to the seventh point in time T7. In some embodiments, the sixth point in time T6 occurs before a read operation of the bit-0 ROM cell 300. In some embodiments, the seventh point in time T7 occurs after the read operation of the bit-0 ROM cell 300. In some embodiments, during the read operation of the bit-0 ROM cell 300, the voltage at the output port becomes a voltage within a voltage range that represents a bit of data equal to 0, due to the configuration of the bit-0 ROM cell 300.

In some embodiments, the waveform 402 illustrates that, at the sixth point in time T6, the voltage at the word-line 302 is within a low voltage state voltage range. In some embodiments, the low voltage state voltage range comprises voltages between about 0 V to about 2 V. In some embodiments, the waveform 404 illustrates that, at the sixth point in time T6, the voltage at the bit-line 304 is within a high voltage state voltage range. In some embodiments, the high voltage state voltage range comprises voltages between about 3 V to about 5 V. In some embodiments, the waveform 406 illustrates that, at the sixth point in time T6, the voltage at the output port is within the high voltage state voltage range.

In some embodiments, the waveform 402 illustrates that, at an eighth point in time T8, the voltage at the word-line 302 begins to change from a voltage within the low voltage state voltage range to a voltage within the high voltage state voltage range. In some embodiments, the waveform 402 illustrates that, at a ninth point in time T9, the voltage at the word-line 302 is within the high voltage state voltage range. In some embodiments, when the voltage at the word-line 302 is within the high voltage state voltage range, the third transistor 308 is activated, which connects the drain of the third transistor 308 to the source of the third transistor 308. In some embodiments, the waveform 406 illustrates that, at the ninth point in time T9, the voltage at the output port begins to change from a voltage within the high voltage state voltage range to a voltage within the low voltage state voltage range. In some embodiments, the voltage within the low voltage state voltage range represents a bit of data equal to 0.

Figure 5:
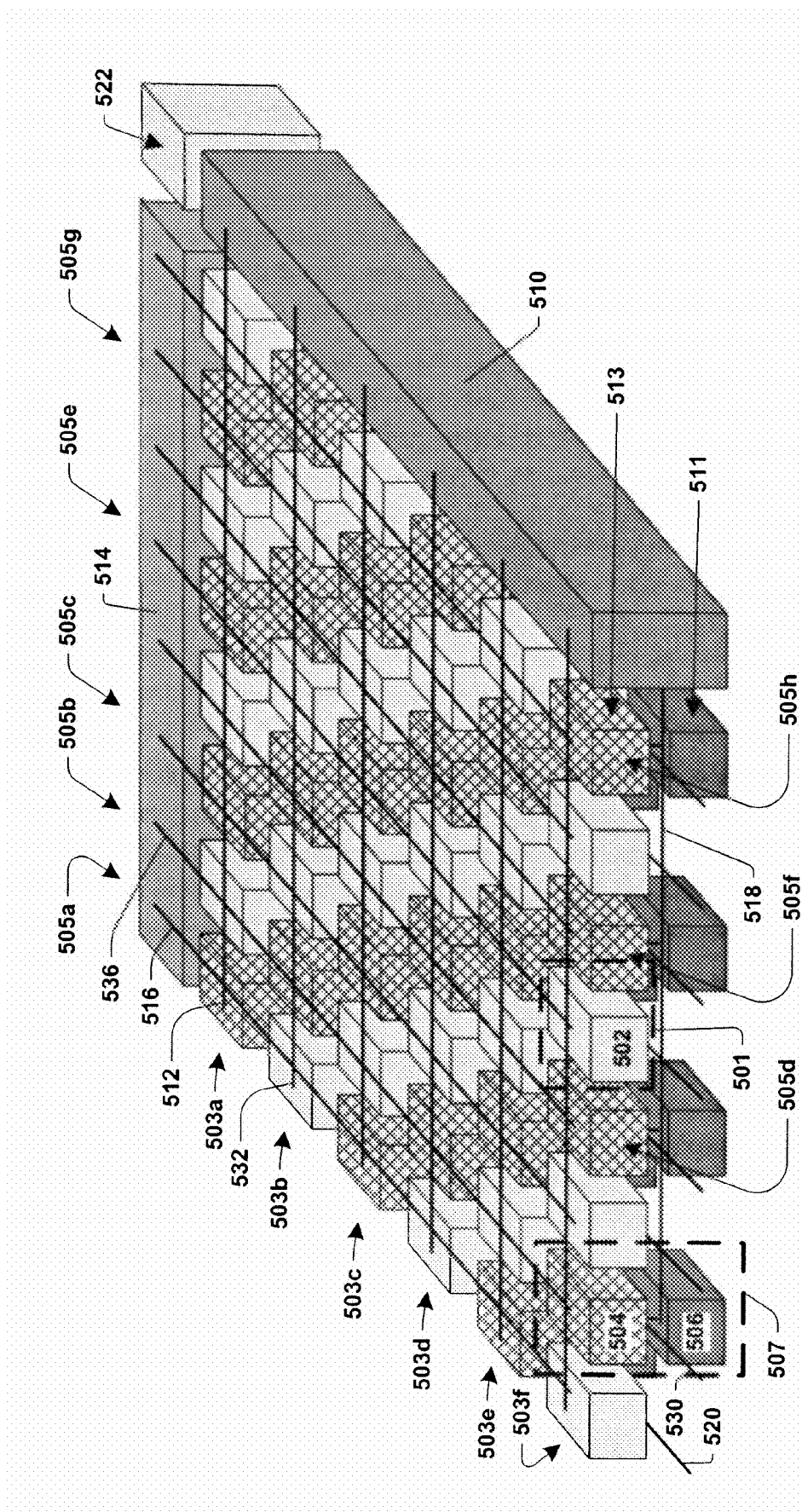
FIG. 5 is an illustration of a portion of a ROM device comprising a memory arrangement, according to some embodiments.

FIG. 5 illustrates a portion of the ROM device comprising the memory arrangement. In some embodiments, the memory arrangement comprises a plurality of ROM cells arranged in rows and columns, such as a first row 503a, a second row 503b, a third row 503c, a fourth row 503d, a fifth row 503e and a sixth row 503f, and a first column 505a, a second column 505b, a third column 505c, a fourth column 505d, a fifth column 505e, a sixth column 505f, a seventh column 505g and an eighth column 505h. The instant application is not limited to the examples provided herein. In some embodiments, the memory arrangement comprises other than six rows of ROM cells. In some embodiments, the memory arrangement comprises other than eight columns of ROM cells.

For simplicity purpose, merely a first bit-1 ROM cell 507 and a first bit-0 ROM cell 501 are labeled in FIG. 5, where the first bit-1 ROM cell 507 comprises a first bit-1 ROM circuit 504 and a first source control circuit 506, and the first bit-0 ROM cell 501 comprises a first bit-0 ROM circuit 502. In some embodiments, the first bit-1 ROM cell 507 corresponds to the bit-1 ROM cell 100 of FIG. 1, the first bit-1 ROM circuit 504 corresponds to the bit-1 ROM circuit 110 of FIG. 1 and the first source control circuit 506 corresponds to the source control circuit 112 of FIG. 1. In some embodiments, the first bit-0 ROM cell 501 corresponds to the bit-0 ROM cell 300 of FIG. 3 and the first bit-0 ROM circuit 502 corresponds to the bit-0 ROM circuit 306 of FIG. 3. While FIG. 5 depicts an orderly or alternating pattern of ROM cells where bit-0 ROM cells and bit-1 ROM cells are uniformly interleaved such that a bit-0 ROM cell is adjacent a bit-1 ROM cell and a bit-1 ROM cell is adjacent a bit-0 ROM cell, the instant application is not so limited. In some embodiments, the memory arrangement is different than as illustrated in FIG. 5. In some embodiments, the memory arrangement has an irregular or non-uniform pattern such that at least one of a bit-0 ROM cell is adjacent to another bit-0 ROM cell or a bit-1 ROM cell is adjacent to another bit-1 ROM cell, instead of the pattern illustrated in FIG. 5.

In some embodiments, the memory arrangement is situated on multiple physical layers, such as different layers of a semiconductor arrangement. In some embodiments, the memory arrangement on multiple physical layers is a 3D architecture. In some embodiments, a first portion of the memory arrangement is situated on a first physical layer 511 and a second portion of the memory arrangement is situated on a second physical layer 513. In some embodiments, a plurality of source control circuits, such as including the first source control circuit 506, that are respectively connected to a plurality of bit-1 ROM circuits are situated on the first physical layer 511. In some embodiments, a plurality of bit-1 ROM circuits, such as including the first bit-1 ROM circuit 504, and a plurality of bit-0 ROM circuits, such as including the first bit-0 ROM circuit 502, are respectively situated on the second physical layer 513. In some embodiments, the first physical layer 511 is situated underneath the second physical layer 513. In some embodiments, the first physical layer 511 is situated above the second physical layer 513.

In some embodiments, the first source control circuit 506 is situated directly below the first bit-1 ROM circuit 504. In some embodiments, the first source control circuit 506 is not situated directly below the first bit-1 ROM circuit 504. In some embodiments, the first source control circuit 506 is situated directly above the first bit-1 ROM circuit 504. In some embodiments, the first source control circuit 506 is not situated directly above the first bit-1 ROM circuit 504.

In some embodiments, the ROM device comprises a plurality of word-lines, such as a first word-line 512, a second word-line 532, etc. In some embodiments, the ROM device comprises a plurality of bit-lines, such as a first bit-line 516, a second bit-line 536, etc. In some embodiments, the ROM device comprises a plurality of word-line bars, such as a first word-line bar 518. In some embodiments, the ROM device comprises a plurality of YMUX connections, such as a first YMUX connection 520, a second YMUX connection 530, etc.

In some embodiments, the plurality of word-lines comprises a number of word-lines that is equal to a number of rows of ROM cells in the memory arrangement. In some embodiments, the plurality of bit-lines comprises a number of bit-lines that is equal to a number of columns of ROM cells in the memory arrangement. In some embodiments, the plurality of word-line bars comprises a number of word-line bars that is equal to the number of rows of ROM cells in the memory arrangement. In some embodiments, the plurality of YMUX connections comprises a number of YMUX connections that is equal to the number of columns of ROM cells in the memory arrangement.

In some embodiments, a word-line within the plurality of word-lines is connected to a plurality of bit-1 ROM circuits and to a plurality of bit-0 ROM circuits within a row corresponding to the word-line. In some embodiments, a bit-line within the plurality of bit-lines is connected to a plurality of bit-1 ROM circuits and to a plurality of bit-0 ROM circuits within a column corresponding to the bit-line. In some embodiments, a word-line bar within the plurality of word-line bars is connected to a plurality of source control circuits within a row corresponding to the word-line bar. In some embodiments, a YMUX connection within the plurality of YMUX connections is connected to a plurality of source control circuits within a column corresponding to the YMUX connection.

In some embodiments, a word-line within the plurality of word-lines is connected to a decoder 510 of the ROM device. In some embodiments, a bit-line within the plurality of bit-lines is connected to an input/output (I/O) circuit 514 of the ROM device. In some embodiments, a word-line bar within the plurality of word-line bars is connected to the decoder 510 of the ROM device. In some embodiments, a YMUX connection within the plurality of YMUX connections is connected to the I/O circuit 514 of the ROM device.

In some embodiments, the decoder 510 is situated on the first physical layer 511. In some embodiments, the decoder 510 is situated on the second physical layer 513. In some embodiments, the decoder 510 is situated on the first physical layer 511 and the second physical layer 513. In some embodiments, the decoder 510 is configured to drive a plurality of word-lines that are connected to the decoder 510, in order to perform read operations.

In some embodiments, the decoder 510 is connected to a clock generator 522. In some embodiments, the clock generator 522 is situated on the first physical layer 511. In some embodiments, the clock generator 522 is situated on the second physical layer 513. In some embodiments, the clock generator 522 is situated on the first physical layer 511 and the second physical layer 513.

In some embodiments, the clock generator 522 generates a plurality of YMUX signals to be applied to the plurality of YMUX connections. A YMUX signal is thus applied to a plurality of source control circuits in a column that corresponds to a YMUX connection.

In some embodiments, the I/O circuit 514 contains a plurality of multiplexers. In some embodiments, a multiplexer within the plurality of multiplexers corresponds to an I/O port. In some embodiments, a multiplexer within the plurality of multiplexers is connected to one or more bit-lines within the plurality of bit-lines. In some embodiments, a multiplexer within the plurality of multiplexers is connected to one bit-line. In this way, in some embodiments, an I/O port corresponds to one bit-line. In some embodiments, a multiplexer within the plurality of multiplexers is connected to two bit-lines. In this way, in some embodiments, an I/O port corresponds to two bit-lines. In some embodiments, a multiplexer within the plurality of multiplexers is connected to four bit-lines. In this way, in some embodiments, an I/O port corresponds to four bit-lines. The instant application is not limited to the foregoing examples, however, because different numbers of multiplexers are connected to different numbers of bit-lines, in some embodiments.

In some embodiments, the I/O circuit 514 is configured to set a voltage of an I/O port to a voltage that represents a bit of data. In some embodiments, the I/O circuit 514 comprises a first multiplexer. In some embodiments, the first multiplexer is connected to a plurality of bit-lines and is configured to select which bit-line of the plurality of bit-lines to be sensed by the I/O circuit 514 using a corresponding plurality of YMUX connections. In some embodiments, when a voltage of a YMUX signal on a YMUX connection is within a high voltage state voltage range, a bit-line within a same column as the YMUX connection is sensed by the I/O circuit 514. In some embodiments, the high voltage state voltage range comprises voltages between about 3 V to about 5 V.

Figure 6:
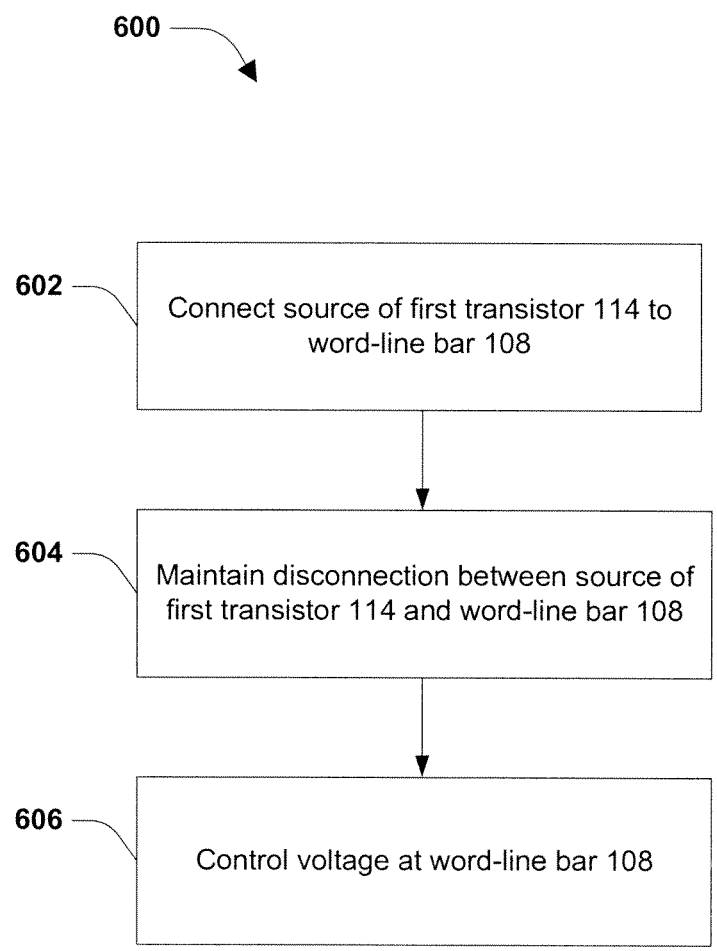
FIG. 6 is a flow diagram illustrating a method for controlling a voltage at a node of a bit-1 ROM cell, according to some embodiments.

FIG. 6 illustrates a method 600 of controlling a voltage at the source of the first transistor 114. In some embodiments, at 602, the source control circuit 112 is configured to provide a connection between the source of the first transistor 114 and the word-line bar 108 when the YMUX signal has a voltage that is within the high voltage state voltage range. In some embodiments, at 604, the source control circuit 112 is configured to maintain a disconnection between the source of the first transistor 114 and the word-line bar 108 when the YMUX signal has a voltage that is within the low voltage state voltage range. In some embodiments, at 606, a voltage at the word-line bar 108 is controlled by the decoder 510.

According to some embodiments, a multi-layer bit-1 ROM cell is provided. In some embodiments, the ROM cell comprises a first circuit and a second circuit. In some embodiments, the first circuit comprises a first transistor. In some embodiments, the second circuit comprises a second transistor. In some embodiments, the second circuit is configured to control a voltage in the first circuit. In some embodiments, the second circuit is located on a different physical layer than the first circuit.

According to some embodiments, a bit-1 ROM cell is provided. In some embodiments, the ROM cell comprises a first circuit and a second circuit. In some embodiments, the first circuit comprises a first transistor. In some embodiments, the second circuit comprises a second transistor. In some embodiments, the second circuit is configured to control a voltage in the first circuit. In some embodiments, the second circuit is connected to a word-line bar and is configured to receive a YMUX signal.

According to some embodiments, a method of controlling a voltage at a node of a bit-1 ROM cell is provided. The method comprises using a second circuit to connect the node to a word-line bar when a YMUX signal has a voltage that is within a first voltage range. The method also comprises using the second circuit to maintain a disconnection between the node and the word-line bar when the YMUX signal has a voltage that is within a second voltage range. The method also comprises controlling a voltage at the word-line bar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A multi-layer bit-1 read-only memory (ROM) cell, comprising:
    a first circuit comprising a first transistor; and
    a second circuit comprising a second transistor, wherein:
        a gate of the second transistor is coupled to a YMUX connection;
        the YMUX connection is coupled to a first multiplexer;
        a source of the second transistor is coupled to a word-line bar;
        the second circuit is configured to control a voltage in the first circuit;
        the second transistor is configured to maintain a disconnection between a source of the first transistor and the word-line bar when a voltage at the YMUX connection is within a low voltage state voltage range; and
        the second circuit is located on a different physical layer than the first circuit.

2. The multi-layer bit-1 ROM cell of claim 1, a drain of the first transistor coupled to a bit-line.

3. The multi-layer bit-1 ROM cell of claim 1, a gate of the first transistor coupled to a word-line.

4. The multi-layer bit-1 ROM cell of claim 1, the source of the first transistor coupled to a drain of the second transistor.

5. The multi-layer bit-1 ROM cell of claim 1, the second transistor configured to maintain a connection between the source of the first transistor and the word-line bar when the voltage at the YMUX connection is within a high voltage state voltage range.

6. The multi-layer bit-1 ROM cell of claim 1, the second circuit located at least one of below or above the first circuit.

7. A bit-1 read-only memory (ROM) cell, comprising:
    a first circuit comprising a first transistor; and
    a second circuit comprising a second transistor, wherein:
        the second circuit is configured to control a voltage in the first circuit;
        a first source/drain of the second transistor is coupled to a word-line bar;
        a gate of the second transistor is coupled to a YMUX connection; and
        the second transistor is configured to maintain a connection between a first source/drain of the first transistor and the word-line bar when a voltage at the YMUX connection is within a high voltage state voltage range.

8. The bit-1 ROM cell of claim 7, a second source/drain of the first transistor coupled to a bit-line.

9. The bit-1 ROM cell of claim 7, a gate of the first transistor coupled to a word-line.

10. The bit-1 ROM cell of claim 7, the second circuit located on a different physical layer than the first circuit.

11. The bit-1 ROM cell of claim 10, the second circuit located at least one of above or below the first circuit.

12. The bit-1 ROM cell of claim 7, a YMUX signal supplied to the gate of the second transistor through the YMUX connection generated by a clock generator.

13. The bit-1 ROM cell of claim 7, the YMUX connection coupled to a first multiplexer.

14. The bit-1 ROM cell of claim 7, the second transistor configured to maintain a disconnection between the first source/drain of the first transistor and the word-line bar when the voltage at the YMUX connection is within a low voltage state voltage range.

15. A bit-1 read-only memory (ROM) cell, comprising:
    a first circuit comprising a first transistor; and
    a second circuit comprising a second transistor, wherein:
        a gate of the second transistor is coupled to a YMUX connection;
        a first source/drain of the second transistor is coupled to a word-line bar;
        the second transistor is configured to maintain a disconnection between a first source/drain of the first transistor and the word-line bar when a voltage at the YMUX connection is within a first voltage state voltage range; and
        the second transistor is configured to maintain a connection between the first source/drain of the first transistor and the word-line bar when the voltage at the YMUX connection is within a second voltage state voltage range different than the first voltage state voltage range.

16. The bit-1 ROM of claim 15, the second transistor located on a different physical layer than the first transistor.

17. The bit-1 ROM of claim 15, the YMUX connection coupled to a first multiplexer.

18. The bit-1 ROM cell of claim 15, the second circuit configured to control a voltage in the first circuit.

19. The bit-1 ROM cell of claim 15, a second source/drain of the first transistor coupled to a bit-line.

20. The bit-1 ROM cell of claim 15, a gate of the first transistor coupled to a word-line of a member arrangement.

* * * * *